(12) United States Patent
Lin

(10) Patent No.: US 6,875,624 B2
(45) Date of Patent: Apr. 5, 2005

(54) COMBINED E-BEAM AND OPTICAL EXPOSURE SEMICONDUCTOR LITHOGRAPHY

(75) Inventor: Chin-Hsiang Lin, Kaohsiung (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 34 days.

(21) Appl. No.: 10/141,614

(22) Filed: May 8, 2002

(65) Prior Publication Data

US 2003/0211751 A1 Nov. 13, 2003

(51) Int. Cl.$^7$ .............................................. H01L 21/66
(52) U.S. Cl. ........................ 438/16; 438/401; 438/462; 257/797
(58) Field of Search ............................ 430/5, 311–313; 438/14–16, 401, 462; 716/11, 19; 257/797

(56) References Cited

U.S. PATENT DOCUMENTS

| | | | | | |
|---|---|---|---|---|---|
| 3,710,101 A | * | 1/1973 | O'Keeffe et al. | ........... | 250/311 |
| 4,610,948 A | * | 9/1986 | Glendinning | ............... | 430/296 |
| 4,612,274 A | * | 9/1986 | Cho et al. | .................... | 430/296 |
| 4,893,163 A | * | 1/1990 | Rudeck | ....................... | 257/797 |
| 5,014,208 A | * | 5/1991 | Wolfson | ........................ | 700/99 |
| 5,427,963 A | * | 6/1995 | Richart et al. | ............... | 438/257 |
| 5,618,751 A | * | 4/1997 | Golden et al. | ............... | 438/392 |
| 5,669,975 A | * | 9/1997 | Ashtiani | .................. | 118/723 L |
| 5,757,879 A | * | 5/1998 | Joshi et al. | .................... | 378/35 |
| 5,766,806 A | * | 6/1998 | Spence | .......................... | 430/5 |
| 6,069,684 A | * | 5/2000 | Golladay et al. | ............. | 355/53 |
| 6,180,947 B1 | * | 1/2001 | Stickel et al. | ........ | 250/396 ML |
| 6,271,602 B1 | * | 8/2001 | Ackmann et al. | ........... | 257/797 |
| 6,370,679 B1 | * | 4/2002 | Chang et al. | .................. | 716/19 |
| 6,451,488 B1 | * | 9/2002 | Rhodes | ........................... | 430/5 |
| 6,470,489 B1 | * | 10/2002 | Chang et al. | .................. | 716/21 |
| 6,498,401 B2 | * | 12/2002 | Yokota | ........................ | 257/797 |
| 6,523,162 B1 | * | 2/2003 | Agrawal et al. | ............... | 716/19 |
| 6,528,799 B1 | * | 3/2003 | Katsap et al. | ................ | 250/398 |
| 6,541,182 B1 | * | 4/2003 | Louis Joseph Dogue et al. | | 430/296 |
| 6,583,041 B1 | * | 6/2003 | Capodieci | .................... | 438/618 |
| 6,605,481 B1 | * | 8/2003 | Wu et al. | ....................... | 438/14 |
| 6,645,677 B1 | * | 11/2003 | Sandstrom | ...................... | 430/5 |
| 6,721,939 B2 | * | 4/2004 | Wang et al. | ................... | 716/21 |
| 2002/0045136 A1 | * | 4/2002 | Fritze et al. | ................. | 430/322 |
| 2002/0071112 A1 | * | 6/2002 | Smith et al. | ................. | 356/124 |
| 2002/0105649 A1 | * | 8/2002 | Smith et al. | ................. | 356/401 |
| 2002/0122994 A1 | * | 9/2002 | Cote et al. | ..................... | 430/5 |
| 2002/0132174 A1 | * | 9/2002 | Pierrat | .......................... | 430/5 |
| 2002/0164064 A1 | * | 11/2002 | Karklin et al. | .............. | 382/145 |
| 2002/0164065 A1 | * | 11/2002 | Cai et al. | ..................... | 382/149 |
| 2002/0188924 A1 | * | 12/2002 | Pierrat et al. | .................. | 716/19 |
| 2003/0073035 A1 | * | 4/2003 | Hsieh | .......................... | 430/296 |

* cited by examiner

*Primary Examiner*—Long Pham
*Assistant Examiner*—Thao X. Le
(74) *Attorney, Agent, or Firm*—Tung & Associates

(57) ABSTRACT

Combined e-beam and optical exposure lithography for semiconductor fabrication is disclosed. E-beam direct writing to is employed to create critical dimension (CD) areas of a semiconductor design on a semiconductor wafer. Optical exposure lithography is employed to create non-CD areas of the semiconductor design on the semiconductor CD's of the semiconductor design can also be separated from non-CD's of the semiconductor design prior to employing e-beam direct writing and optical exposure lithography.

10 Claims, 7 Drawing Sheets

COMBINED E-BEAM AND OPTICAL EXPOSURE SEMICONDUCTOR LITHOGRAPHY

FIELD OF THE INVENTION

This invention relates generally to semiconductor fabrication, and more particularly to semiconductor lithography as can be performed in such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in optical photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on optical lithographic processes. Resolution of anything smaller than a wavelength is generally quite difficult. Pattern fidelity can deteriorate dramatically in sub-wavelength lithography. Critical dimensions (CD's), which are the geometries and spacings used to monitor the pattern size and ensure that it is within the customer's specification, are especially important to have size maintenance during processing. Semiconductor features may deviate significantly in size and shape from the ideal pattern drawn by the circuit designer. These distortions include line-width variations dependent on pattern density, which affect a device's speed of operation, and line-end shortening, which can break connections to contacts. To avoid these and other optical proximity effects, the semiconductor industry has attempted to compensate for them in the photomasks themselves.

This compensation is generally referred to as optical proximity correction (OPC). The goal of OPC is to produce smaller features in an IC using a given equipment set by enhancing the printability of a wafer pattern. OPC applies systematic changes to mask geometries to compensate for the nonlinear distortions caused by optical diffraction and resist process effects. A mask incorporating OPC is thus a system that negates undesirable distortion effects during pattern transfer. OPC works by making small changes to the IC layout that anticipate the distortions. OPC offers basic corrections and a useful amount of device yield improvement, and enables significant savings by extending the lifetime of existing lithography equipment. Distortions that can be corrected by OPC include line-end shortening, corner rounding, isolated-dense proximity effect, and isolated-line depth of focus reduction.

Another difficulty with sub-wavelength photolithography is that, as two mask patterns get closer together, diffraction problems occur. At some point, the normal diffraction of the exposure rays start touching, leaving the patterns unresolved in the resist. The blending of the two diffraction patterns into one results from all the rays being in the same phase. Phase is a term that relates to the relative positions of a wave's peaks and valleys. One way to prevent the diffraction patterns from affecting two adjacent mask patterns is to cover one of the openings with a transparent layer that shifts one of the sets of exposing rays out of phase, which in turn nulls the blending.

This is accomplished by using a special type of photomask known as a phase shift mask (PSM). A typical photomask affects only one of the properties of light, the intensity. Where there is chromium, which is an opaque region, an intensity of zero percent results, whereas where the chromium has been removed, such that there is a clear or transparent region, an intensity of substantially 100 percent results. By comparison, a PSM not only changes the intensity of the light passing through, but its phase as well. By changing the phase of the light by 180 degrees in some areas, the PSM takes advantage of how the original light wave adds to the 180-degree wave to produce zero intensity as a result of destructive interference.

Another particular issue that impacts the quality of optical lithography is focus variation, which is nearly ubiquitous in IC manufacturing because of the combined effects of many problems, such as wafer non-flatness, auto-focus errors, leveling errors, lens heating, and so on. A useful optical exposure process should be able to print acceptable patterns in the presence of some focus variation. Similarly, a useful optical exposure process should be able to print acceptable patterns in the presence of variation in the exposure dose, or energy, of the light source being used. To account for these simultaneous variations of exposure dose and focus (or lack thereof), it is useful to map out the process window, such as an exposure-defocus (ED) window, within which acceptable lithographic quality occurs. The process window for a given feature shows the ranges of exposure dose and depth of focus (DOF) that permit acceptable quality.

All of these considerations make for difficult optical photolithographic processing. Utilizing OPC in photomasks, and employing PSM photomasks, renders the resulting photomasks complicated, increasing the mask error factor (MEF) of such photomasks. Poor resolution and DOF results in a small process window in which to perform traditional optical lithography. Thus, utilizing traditional optical photolithography with complicated photomasks for semiconductor fabrication has become difficult, even though optical photolithography is a desired process in that it is a quick process.

One solution is to write on the semiconductor wafer directly, using an electron beam, or e-beam, instead of using traditional optical exposure. E-beam lithography, as it is known uses an electron source that produces a small diameter spot, or shot, and a blanker capable of turning the beam on and off. The exposure takes place in a vacuum to prevent air molecules from interfering with the electron beam. The beam passes through electrostatic plates capable of directing, or steering, the beam in the x and y directions on the wafer. Precise direction of the beam usually requires that the beam travel in a vacuum camber in which there is the electron beam source, support mechanisms, and the substrate being exposed.

Since a computer generates the desired pattern, the beam is directed to specific positions on the wafer surface by a deflection subsystem, and the beam turned on where the resist is to be exposed. Larger substrates are mounted on an x-y stage and are moved under the beam to achieve full surface exposure. This alignment and exposure technique is referred to as direct writing. The pattern is exposed in the mask by either raster or vector scanning. In the former, a computer directs the movement and activates the blanker in desired regions. A drawback to raster scanning is the time required for the beam to scan, since it travels over the entire surface of the wafer. By comparison, in vector scanning, the beam is moved directly to the regions that have to be exposed. At each position, small square- or rectangular-shaped areas are exposed, building up the desired shape of the exposed area.

E-beam direct writing overcomes some of the problems associated with optical photolithography. It generally avoids the small process window of conventional optical photolithography. Furthermore, it generally allows for highly precise CD's, that otherwise would require complex optical photomasks that employ OPC, and that are PSM's. However, e-beam writing has the unfortunate disadvantage that it is significantly slower than conventional optical photolithography. For example, e-beam direct writing may be about ten times slower than optical exposure techniques.

Therefore, there is a need photolithography that overcomes these disadvantages in the manufacture of photomasks. Specifically, there is a need for photolithography that allows for highly precise CD's, without the difficulty of optical exposure techniques. Such photolithography should further be faster than traditional e-beam direct writing. For these and other reasons, there is a need for the present invention.

SUMMARY OF THE INVENTION

The invention relates to combined e-beam and optical exposure lithography for semiconductor fabrication. A method of the invention employs e-beam direct writing to create critical dimension (CD) areas of a semiconductor design on a semiconductor wafer. The method also employs optical exposure lithography to create non-CD areas of the semiconductor design on the semiconductor wafer. The method can also separate CD's of the semiconductor design from non-CD's of the semiconductor design prior to employing e-beam direct writing and optical exposure lithography.

Embodiments of the invention provide for advantages over the prior art. The relatively small number of CD areas of a semiconductor design are transferred to a semiconductor wafer by the relatively slow, but highly precise, process of e-beam writing. Conversely, the relatively large number of non-CD areas of the semiconductor design are transferred to the wafer by the relatively fast, but less precise, process of optical exposure lithography. Therefore, the CD's of the semiconductor design are properly transferred to the wafer, while still for the most part ensuring the high throughput and yield that are characteristics of optical exposure lithography. That is, e-beam writing is used only as is necessary. Thus, the combination of e-beam writing and optical exposure is used on the same wafer to obtain good resolution and depth of focus (DOF) via the e-beam writing, and also to obtain to high throughput of optical exposure.

Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
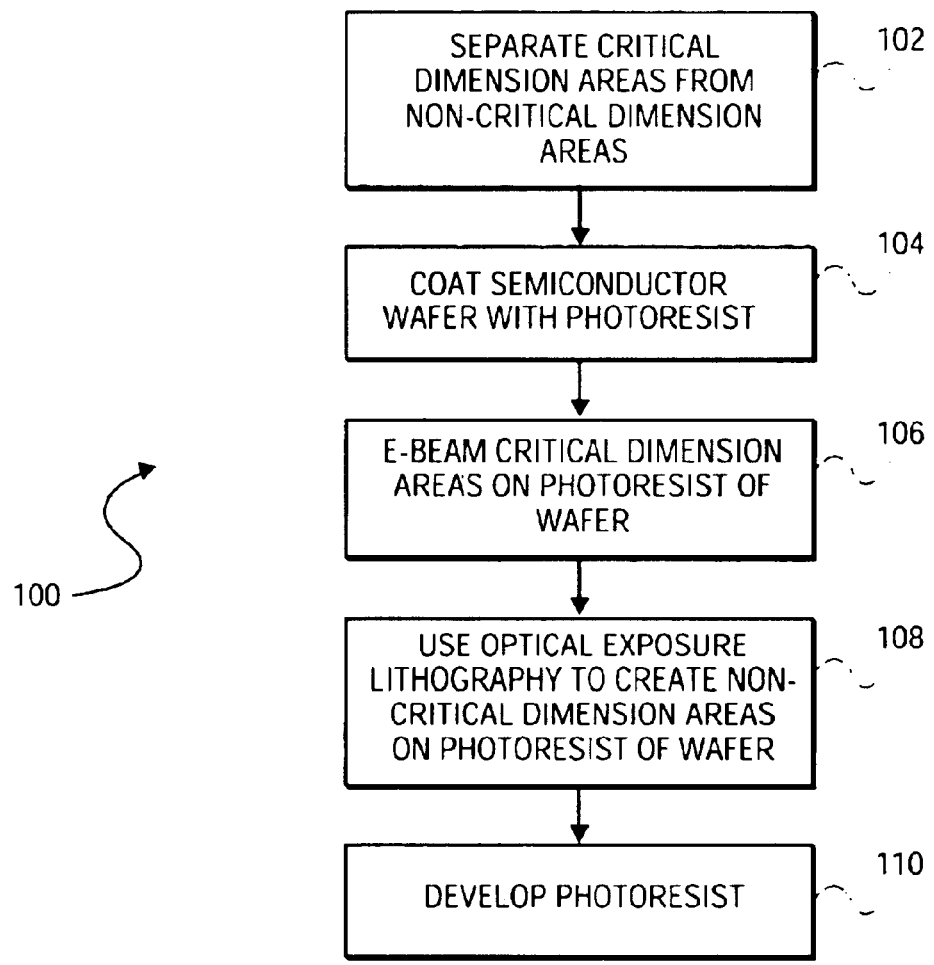
FIG. 1 is a flowchart of a method for e-beam direct writing critical dimension (CD) areas of a semiconductor design and performing optical exposure photolithography of non-CD areas of the design, according to an embodiment of the invention.

FIG. 1 shows a method 100 in accordance with which one embodiment fabricates semiconductor devices according to a semiconductor design on a semiconductor wafer. Critical dimension (CD) areas of the semiconductor design are first separated from non-CD areas of the semiconductor design (102). That is, critical layouts of a layout file are separated from non-critical layouts of the layout file. The critical layouts are formed as a group in one layer to be exposed by electron (e-) beam direct writing, and the non-critical layouts are formed as a group in another layer to be exposed by optical exposure lithography using a photomask.

Figure 2:
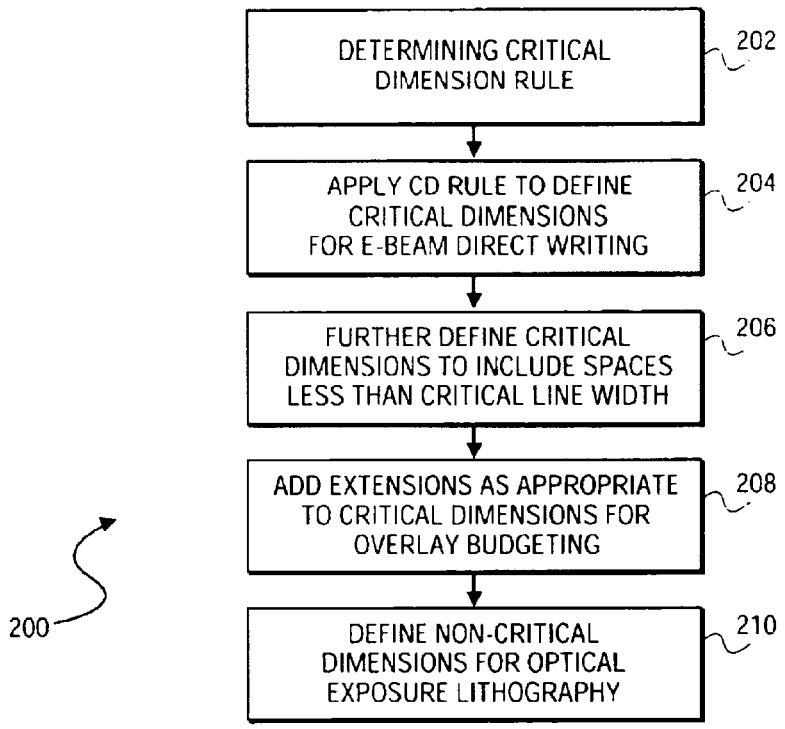
FIG. 2 is a flowchart of a method for dividing the CD areas of a semiconductor design from the non-CD areas of the design, according to an embodiment of the invention.

FIG. 2 shows a method 200 in accordance with which one embodiment implements 102 of FIG. 1 to separate CD areas from non-CD areas. First, a CD rule is determined that governs which dimensions of the semiconductor design are CD's and which dimensions of the design are not critical, or non-CD's (202). The CD rule may be that a CD is a dimension less than a threshold number of microns. As another example, the CD rule may be that CD's include those dimensions of features that have a pitch less than a threshold number of microns, where the lower the pitch, the greater the density of the features in the semiconductor design.

Next, the CD rule is applied to the dimensions of the semiconductor design to define the CD's on a layer for e-beam direct writing on a semiconductor wafer (204). The layer may be a sub-layer of a layout file. Furthermore, there may be difficult-to-print spaces via optical exposure there are not technically CD's. However, these spaces, too, are included in the definition of critical dimensions (206). Such spaces are generally those between two polygons of the semiconductor design that are separated by less than a threshold, such as the same threshold used in the CD rule.

Extensions are also added, as appropriate, to features of the semiconductor design that have been deemed CD's, to compensate for overlay budgeting (208). As can be appreciated by those of ordinary skill within the art, e-beam direct writing can sometimes require extensions at some line ends for overlay budgeting for any errors during alignment. The amount added in an extension depends on the alignment precision capability of the semiconductor fabrication equipment used when performing the e-beam direct writing followed by the optical exposure lithography of embodiments of the invention. Finally, the method 200 defines non-CD's on a layer for optical exposure lithography on the semiconductor wafer (210). This layer may also be a sub-layer of a layout file.

Figure 3:
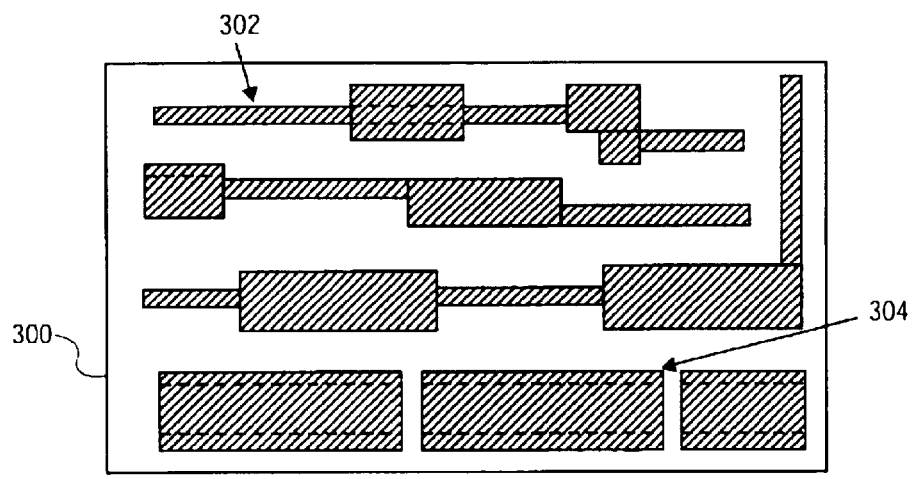
FIGS. 3, 4, 5, and 6 are diagrams showing an example semiconductor design on which the method of FIG. 2 can be performed, according to an embodiment of the invention.
Figure 4:
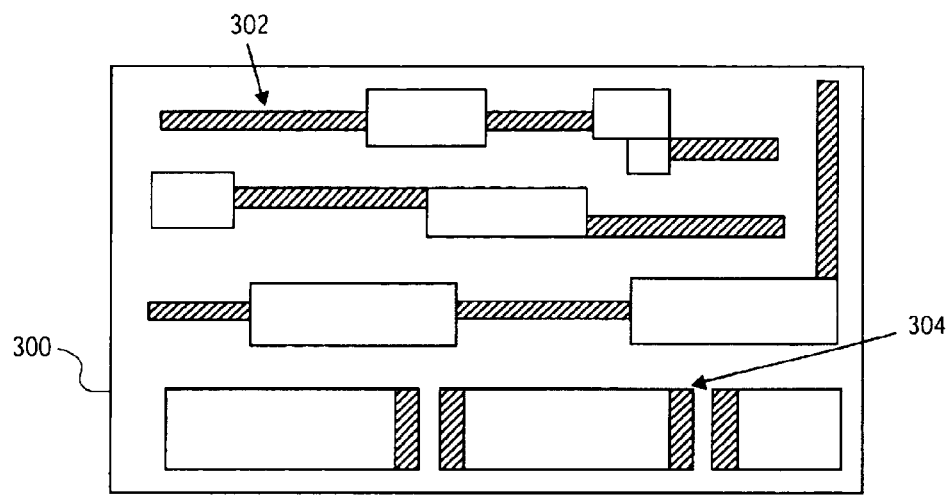
Figure 5:
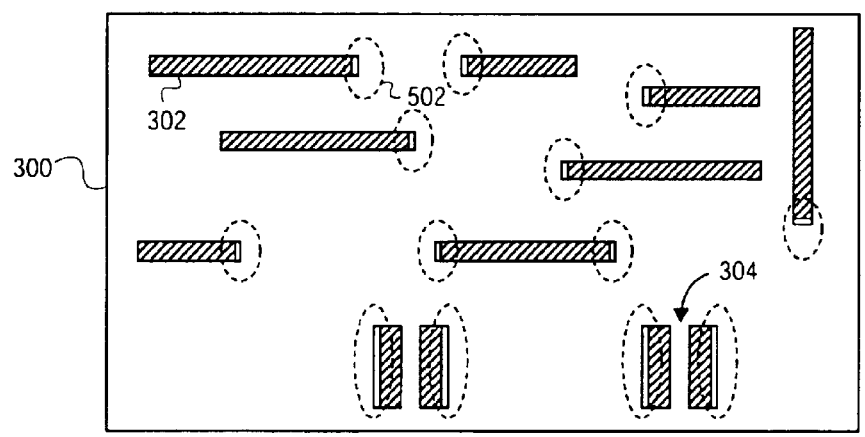
Figure 6:
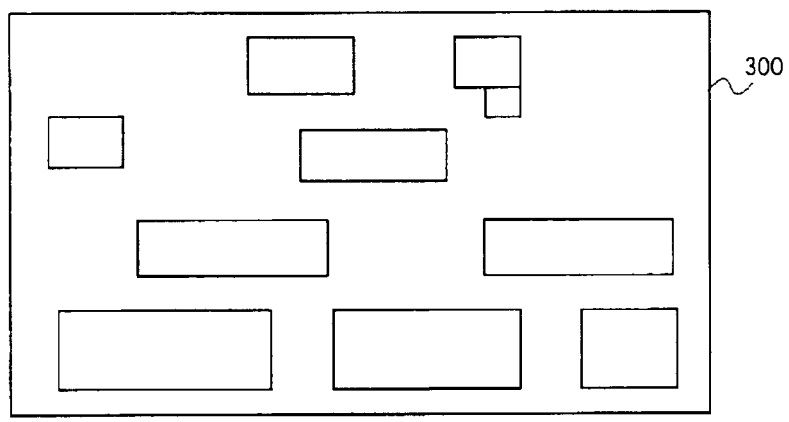

FIG. 3 shows an example semiconductor design 300, such as a circuit layout, on which the method 200 can be performed. The design 300 includes a critical line 302, which is more generally a critical feature, and a small space 304. FIG. 4 shows the design 300 after 204, 206, and 210 of the method 200 have been applied on the design 300. The shaded parts of the design 300 correspond to CD areas that will be exposed using e-beam direct writing, whereas the non-shaded parts of the design 300 correspond to non-critical areas that will be exposed using optical exposure lithography. The design 300 still includes the critical line 302 and the space 304. FIG. 5 further shows the design 300 of FIG. 4 after 208 of FIG. 2 has been applied on the design 300. The dotted circled areas, such as the dotted circled area 502, indicate where small extensions have been added. Finally, FIG. 6 shows only the non-CD areas of the design 300.

Figure 7:
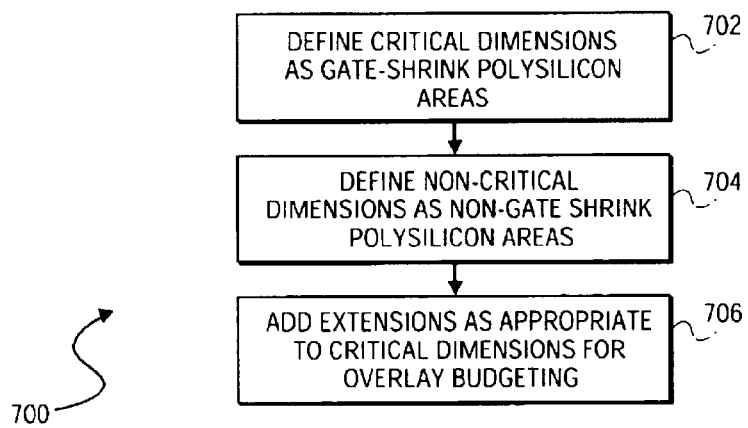
FIG. 7 is a flowchart of a method for dividing the CD areas of a semiconductor design from the non-CD areas of the design, according to another embodiment of the invention.

FIG. 7 shows a method 700 in accordance with which another embodiment of the invention implements 102 of FIG. 1 to separate CD areas from non-CD areas. First, the CD's of the semiconductor design are defined as a first layer, such as a first sub-layer of a layout file, for e-beam direct writing (702). These areas are the gate-shrink polysilicon areas of the polysilicon gate layers of the semiconductor design, where the design preferably also has OD-active layers. Next, the non-CD's are defined to a second layer, such as a second sub-layer of a layout file, for optical exposure lithography (704). These areas are the non-gate shrink polysilicon areas of the polysilicon gate layers of the semiconductor design. Extensions can also be added to the CD's, as appropriate, to compensate for overlay budgeting, as has been described (706).

Figure 9:
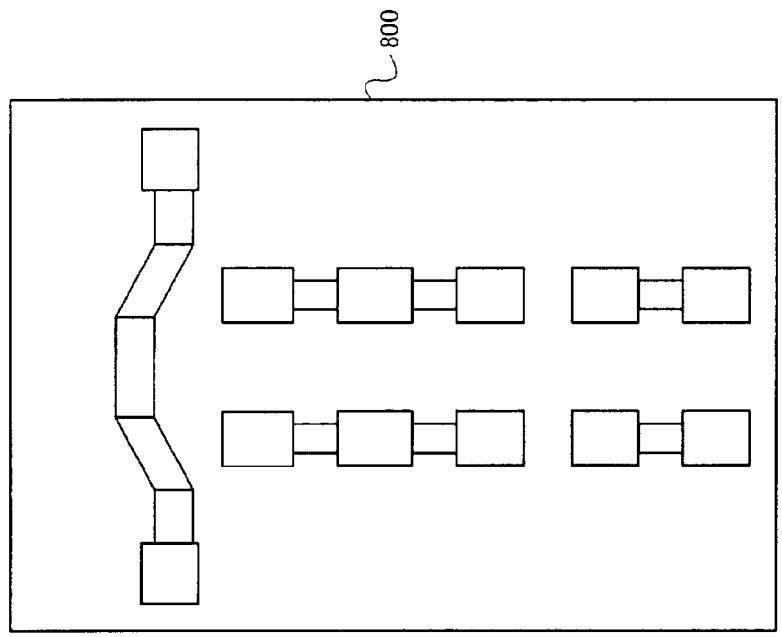
FIGS. 8, 9, 10, and 11 are diagrams showing an example semiconductor design on which the method of FIG. 7 can be performed, according to an embodiment of the invention.
Figure 8:
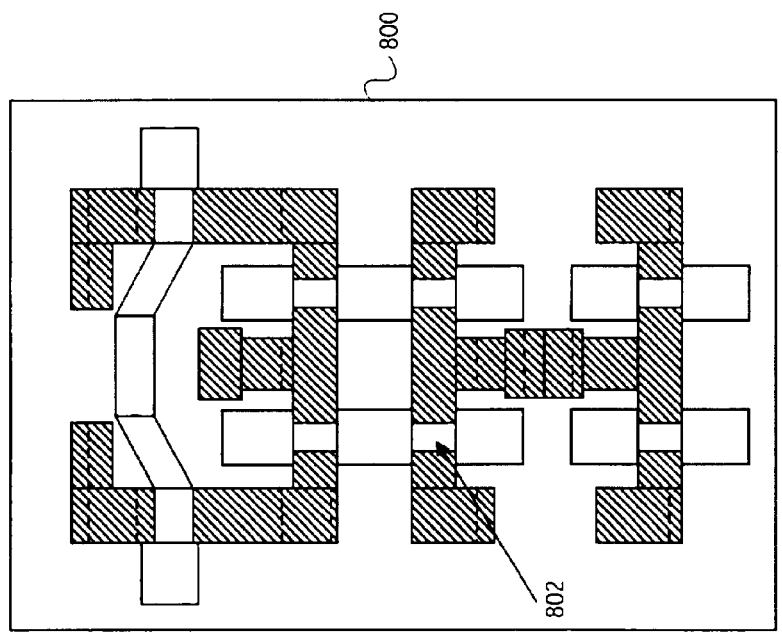
Figure 11:
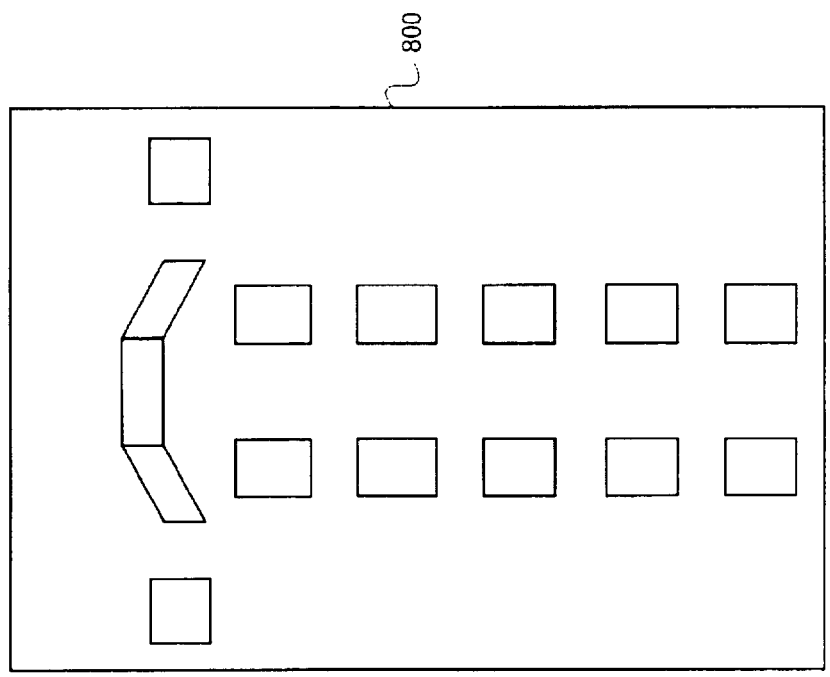
Figure 10:
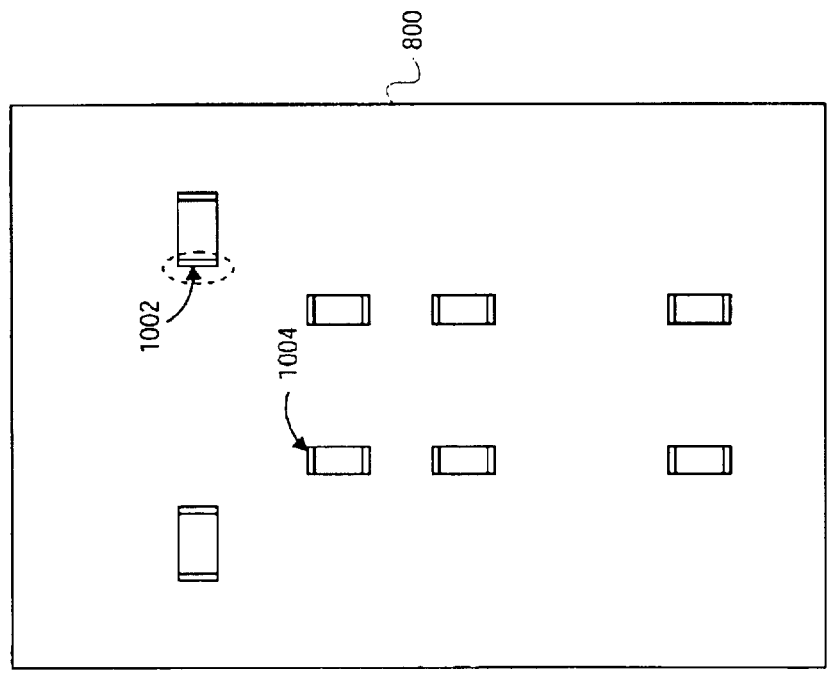

FIG. 8 shows an example semiconductor design 800, such as a circuit layout, on which the method 700 can be performed. The design 800 specifically includes a number of gate-shrink areas, such as the gate-shrink area 802. The non-shaded parts of the design 800 of FIG. 8 correspond to the polysilicon gate layer that will be exposed using e-beam direct writing and optical exposure lithography according to an embodiment of the invention, whereas the non-shaded parts of the design 800 of FIG. 8 correspond to an OD-active layer. FIG. 9 shows just the polysilicon gate layer of the design 800. FIG. 10 shows the design 800 after 702 and 706 of FIG. 7 have been applied. The only parts of the design 800 shown in FIG. 10 are those CD's that will be exposed using e-beam direct writing. Furthermore, extensions, such as the extensions 1002 and 1004, have been added for overlay budgeting. Conversely, FIG. 11 shows the design 800 after 704 of FIG. 7 has been applied, where the only parts of the design 800 shown in FIG. 11 are those non-CD's that will be exposed using optical exposure lithography.

Referring back to FIG. 1, after the CD areas have been separated from the non-CD areas, the semiconductor wafer is coated with photoresist (104). Preferably, a photoresist is used that is sensitive to both e-beam exposure and optical exposure when using the same developer to develop the exposed photoresist. Optical exposure may be 365 nanometers (nm) optical exposure, 248 nm optical exposure, 193 nm exposure, 157 nm exposure, as well as other types of optical exposure. As an example, the UV series resist available from Shipley Corporation, of Marlborough, Mass., may be used, such as the Shipley UV-II resist. The Shipley UV-II resist is sensitive to e-beam exposure from about 20 to 30 uC/cm$^2$ under a 50 KeV e-beam, and is also sensitive to 248 nm optical exposure with 15 to 25 mj/cm$^2$. For OD layers, polysilicon layers, or other dark layers, negative resist is preferably used, whereas for metal layers, such as when using a copper damascene process, positive resist is preferably used.

Next, the CD areas of the semiconductor design are created on the semiconductor wafer by using e-beam direct writing (106). That is, e-beam direct writing the CD areas on the photoresist coating on the wafer is performed. The e-beam writing may be accomplished by using either scanner e-beam writing or vector e-beam writing. Optical exposure lithography is then employed to create the non-CD areas of the semiconductor design on the semiconductor wafer (108). For example, a photomask having the non-CD areas of the semiconductor design may be aligned over the photoresist coating the semiconductor wafer. Then the photoresist coating is exposed with a light source through this photomask. This optical lithographic process may be accomplished by using stepper and scanner semiconductor photolithographic equipment.

Figure 12:
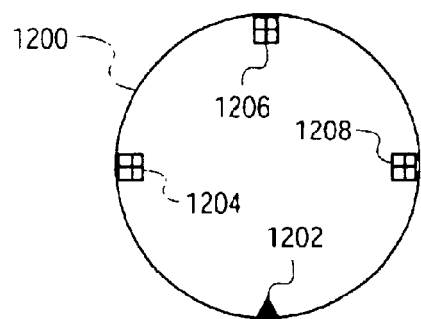
FIG. 12 is a diagram showing a semiconductor wafer having common alignment marks for both e-beam direct writing and optical exposure lithography, according to an embodiment of the invention.

Finally, the photoresist on the semiconductor wafer is developed (110), which removes those parts of the photoresist that have been exposed, either by optical lithography or e-beam writing. That is, the photoresist coating the wafer is partially removed through the development process, in accordance with the semiconductor design, as the design has been exposed on the photoresist via e-beam writing and optical lithography. To ensure proper alignment between the e-beam direct writing and the optical exposure lithography, preferably a common alignment mark is produced on the photoresist coating the wafer, where the alignment mark is used in both e-beam direct writing and optical exposure lithography. FIG. 12 shows an example semiconductor wafer 1200, with a notch 1202, that has such common alignment marks 1204, 1206, and 1208. Fine alignment is preferred for both e-beam writing and optical exposure.

Figure 13:
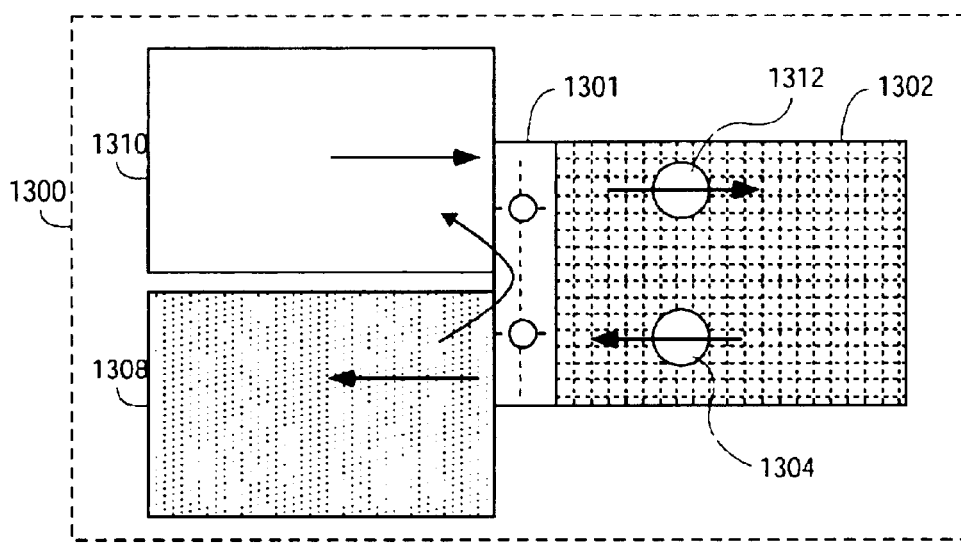
FIG. 13 is a diagram of a system for performing e-beam direct writing and optical exposure lithography, according to an embodiment of the invention.

FIG. 13 shows a system 1300 in conjunction with which the method 100 of FIG. 1 can be implemented, according to an embodiment of the invention. The system 1300 includes a track system 1302, an interface module 1306, an e-beam writer 1308, and a stepper and scanner 1310. As indicated as the position 1304, the semiconductor wafer is first coated with photoresist. Next, the interface module 1306, which can be a robot arm controlled by software, is used to move the wafer from the track system 1302 to the e-beam writer 1308, where e-beam direct writing of the CD areas is accomplished. The interface module 1306 then moves the wafer from the e-beam writer 1308 to the stepper and scanner 1310, where optical exposure lithography is performed. The interface module 1306 finally moves the wafer from the stepper and scanner 1310 back to the track system 1302. As indicated as the position 1312, the wafer is finally developed. Preferably, chemical filtering is accomplished throughout the system 1300.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method for fabricating one or more semiconductor devices according to a semiconductor design on a semiconductor wafer comprising:

coating the semiconductor wafer with photoresist;

producing a common alignment mark on the photoresist coating the semiconductor wafer for use in both e-beam direct writing and optical exposure lithography;

creating critical dimension (CD) areas of the semiconductor design on the semiconductor wafer with electron (e-) beam direct writing, the CD areas including CD's that are geometries and spacings used to monitor pattern size and ensure that the pattern size is within specification; and, creating non-CD areas of the semiconductor design on the semiconductor with optical exposure lithography.

2. The method of claim 1, wherein e-beam direct writing comprises e-beam direct writing the CD areas on the photoresist coating the semiconductor wafer.

3. The method of claim 1, wherein optical exposure lithography comprises:

aligning a photomask having the non-CD areas of the semiconductor design over the photoresist coating the semiconductor wafer; and, exposing the photoresist coating the semiconductor wafer with a light source through the photomask.

4. The method of claim 1, further comprising developing the photoresist coating the semiconductor wafer to partially remove the photoresist in accordance with the semiconductor design.

5. The method of claim 4, wherein the photoresist is sensitive to both e-beam direct writing and optical exposure lithography using a same developer to partially move the photoresist.

6. The method of claim 1, wherein the photoresist is one of positive photoresist and negative photoresist.

7. The method of claim 1, wherein optical exposure lithography comprising using stepper and scanner semiconductor photolithographic equipment.

8. The method of claim 1, wherein e-beam writing comprises one of scanner e-beam writing and vector e-beam writing.

9. The method of claim 1, further initially comprising separating the CD's areas of the semiconductor design on a first layer from the non-CD areas of the semiconductor design on a second layer by applying a CD rule governing which of a plurality of dimensions of the semiconductor design are the CD's.

10. The method of claim 1, further initially comprising defining the CD's areas of the semiconductor design on a first layer as gate-shrink polysilicon areas of polysilicon gate layers of the semiconductor design, and defining the non-CD areas of the semiconductor design on a second layer as non-gate shrink polysilicon areas of the polysilicon gate layers.

* * * * *